(12) United States Patent
Phua et al.

(10) Patent No.: US 7,528,445 B2
(45) Date of Patent: May 5, 2009

(54) WING GATE TRANSISTOR FOR INTEGRATED CIRCUITS

(75) Inventors: Timothy Phua, Singapore (SG); Kheng Chok Tee, Selangor (MY); Liang Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 53 days.

(21) Appl. No.: 11/380,378

(22) Filed: Apr. 26, 2006

(65) Prior Publication Data

US 2006/0180848 A1   Aug. 17, 2006

Related U.S. Application Data

(62) Division of application No. 10/820,664, filed on Apr. 7, 2004, now Pat. No. 7,056,799.

(51) Int. Cl.
*H01L 29/76* (2006.01)
*H01L 31/113* (2006.01)
*H01L 21/338* (2006.01)

(52) U.S. Cl. ............... 257/344; 257/408; 257/E21.205; 438/182

(58) Field of Classification Search ............... 257/344, 257/387, E29.267, 408, 412, E21.205; 438/182
See application file for complete search history.

(56) References Cited

U.S. PATENT DOCUMENTS

| | | | |
|---|---|---|---|
| 6,255,165 B1 | 7/2001 | Thurgate et al. | |
| 6,482,688 B2 | 11/2002 | Hu et al. | |
| 6,596,599 B1 | 7/2003 | Guo | |
| 7,118,942 B1 * | 10/2006 | Li | 438/142 |
| 2004/0038436 A1 * | 2/2004 | Mori et al. | 438/17 |
| 2004/0113212 A1 * | 6/2004 | Lee et al. | 257/408 |
| 2004/0129959 A1 * | 7/2004 | Kim et al. | 257/288 |

* cited by examiner

*Primary Examiner*—Hsien-ming Lee
(74) *Attorney, Agent, or Firm*—Mikio Ishimaru

(57) ABSTRACT

A system is provided for forming a semiconductor device. Layers of gate dielectric material, gate material, and cap material are formed on a semiconductor substrate. The cap material and a portion of the gate material are processed to form a cap and a gate body portion. A wing on the gate body portion is formed from a remaining portion of the gate material. The gate dielectric material under a portion of the wing on the gate body portion is removed to form a gate dielectric. A lightly-doped source/drain region is formed in the semiconductor substrate using the gate body portion and the wing.

8 Claims, 4 Drawing Sheets

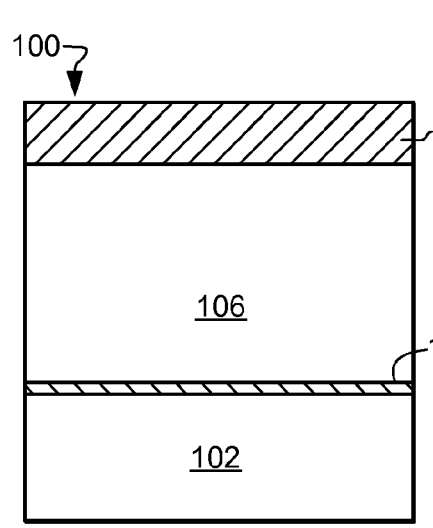
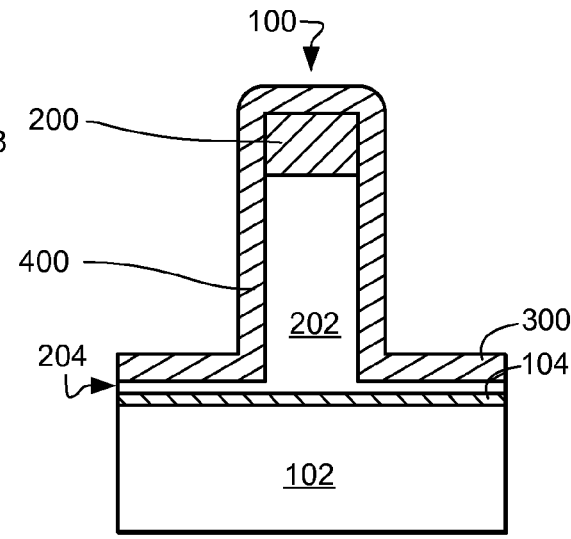
FIG. 1
FIG. 3
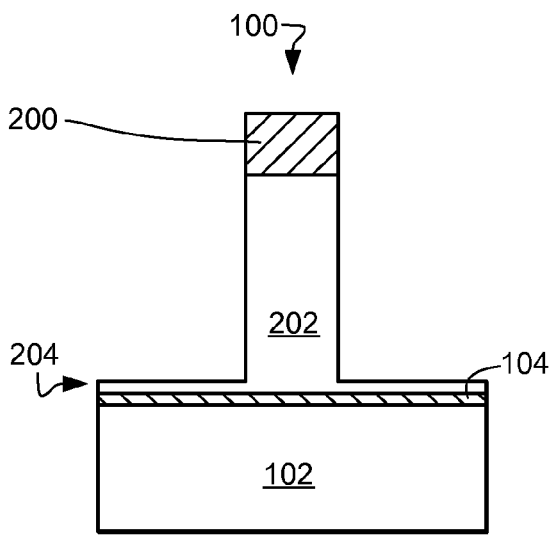
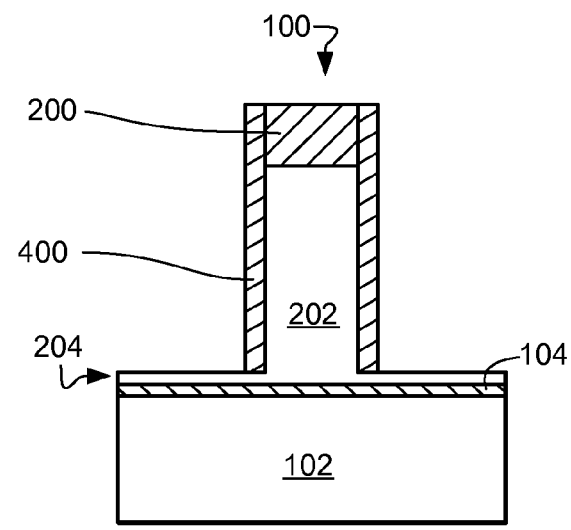
FIG. 2
FIG. 4

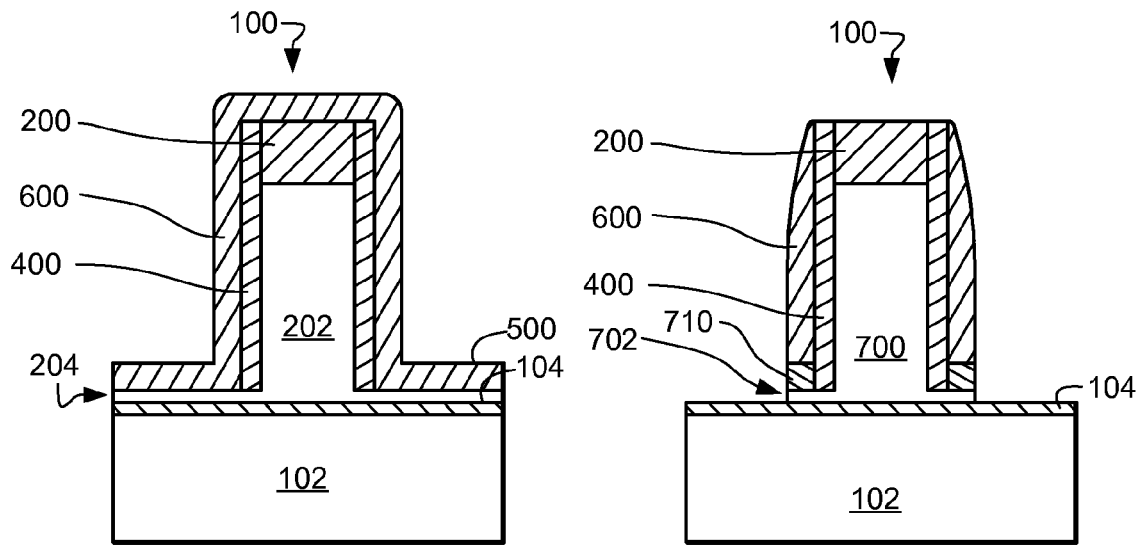
FIG. 5
FIG. 7
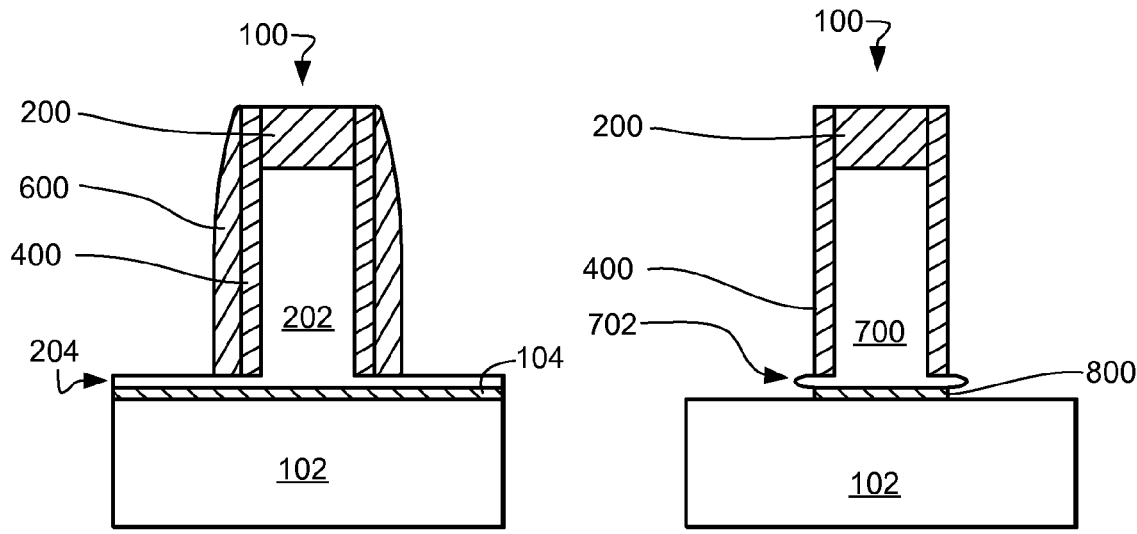
FIG. 6
FIG. 8

WING GATE TRANSISTOR FOR INTEGRATED CIRCUITS

CROSS-REFERENCE TO RELATED APPLICATION(S)

This is a divisional of patent application Ser. No. 10/820,664 filed Apr. 7, 2004, now U.S. Pat. No. 7,056,799 B2.

BACKGROUND

1. Field of the Invention

The present invention relates generally to integrated circuits, and more particularly to reduced-size transistors.

2. Background of the Invention

The present invention relates generally to electronics and more particularly to electronic components.

Semiconductor devices such as transistors, are formed in and upon semiconductor substrates. These circuit elements are interconnected by contacts and vias, which connect to patterned conductor layers which are separated by various dielectric layers.

A critical objective of the semiconductor industry has been to continually decrease the size of semiconductor devices to increase performance and reduce cost for applications such as cellphones and portable CD players. As semiconductor technology has advanced, there has been a continuing concentration on reducing the size of the semiconductor devices to allow for increased levels of circuit integration, improved performance, and higher density.

As the advancement in semiconductor technology accelerates according to Moore's Law, much of the work being done is to reduce the channel length of for semiconductor devices such as transistors. However, as the size of the transistor is reduced, the punch-through performance, threshold voltage roll-off, and other short channel effects become problematic.

Performance of shrinking transistors, like off/on state current, threshold roll-off, etc. are becoming a major concern. Moreover, for short-channel devices, the threshold voltage and leakages are reaching the point where the transistors would not be operational.

As semiconductor devices continue to be reduced in size, it is clear that a breakthrough solution to these problems is required for continued success in reducing semiconductor device size and thus increasing device integration, performance, and function while at the same time reducing cost.

Solutions to these problems have been long sought, but have also long eluded those skilled in the art.

SUMMARY OF THE INVENTION

The present invention provides a system for forming a semiconductor device. Layers of gate dielectric material, gate material, and cap material are formed on a semiconductor substrate. The cap material and a portion of the gate material are processed to form a cap and a gate body portion. A wing on the gate body portion is formed from a remaining portion of the gate material. The gate dielectric material under a portion of the wing on the gate body portion is removed to form a gate dielectric. A lightly-doped source/drain is formed in the semiconductor substrate using the gate body portion and the wing. The present invention permits shrinking of transistors while improving punch-through performance, threshold voltage roll-off, and other short-channel effects.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a view of a semiconductor device in an intermediate stage of manufacture in accordance with the present invention;

FIG. 2 is the structure of FIG. 1 after further processing of cap and gate material layers;

FIG. 3 is the structure of FIG. 2 after deposition of a first spacer material layer;

FIG. 4 is the structure of FIG. 3 after formation of a first spacer;

FIG. 5 is the structure of FIG. 4 after deposition of a second spacer layer;

FIG. 6 is the structure of FIG. 5 after formation of a second spacer;

FIG. 7 is the structure of FIG. 6 after formation of a wing gate;

FIG. 8 is the structure of FIG. 7 after removing the second spacer and exposure of the tips of the gate wings;

DESCRIPTION OF THE PREFERRED EMBODIMENT

Figure 9:
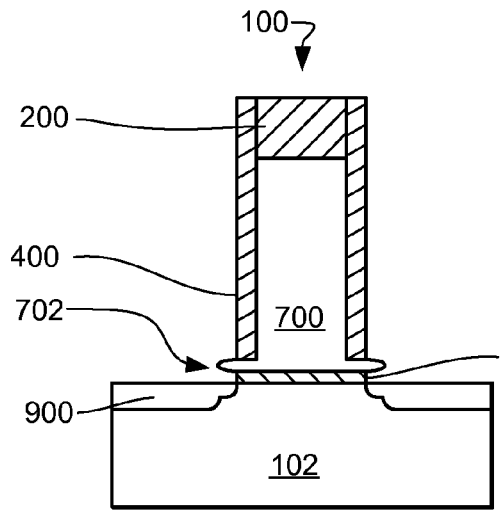
FIG. 9 is the structure of FIG. 8 after implantation of a dopant to form lightly-doped source/drains regions.

Referring now to FIG. 1, therein is shown a semiconductor device 100, such as a transistor, in an intermediate stage of manufacture. A well has been formed in a semiconductor substrate 102, such as a silicon substrate, and processing performed to form a gate dielectric layer 104, such as a silicon dioxide or nitrided oxide. A gate material layer 106, such as amorphous or polycrystalline silicon, has been deposited on the gate dielectric layer 104, and a cap material layer 108, such as nitride, has been deposited on the gate material layer 106.

The drawings showing embodiments of the invention are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

Likewise, in the following description, numerous specific details are given to provide a thorough understanding of the invention. However, it will apparent that the invention may be practiced without these specific details. In order to avoid obscuring the present invention, some well-known system configurations and process steps are not disclosed in detail.

The term "horizontal" as used herein is defined as a plane parallel to the conventional plane or surface of the semiconductor substrate, regardless of its orientation. The term "vertical" refers to a direction perpendicular to the horizontal as just defined. Terms, such as "on", "above", "below", "bottom", "top", "over", and "under", are defined with respect to the horizontal plane.

Referring now to FIG. 2, therein is shown the structure of FIG. 1 after further processing of the cap and gate material layers 106 and 108. A mask (not shown) has been deposited and processed for the etching of the cap material layer 108 to form a cap 200. The cap 200 is used as a mask for the etching of the gate material layer 106 to form a gate body portion 202 with a gate thin layer portion 204 of gate material still remaining over the gate dielectric layer 104. The gate thin layer portion 204 has a thickness "t" under about 100 Å.

Referring now to FIG. 3, therein is shown the structure of FIG. 2 after deposition of a first spacer material layer 300, such as nitride. The first spacer material layer 300 is conformal and has a thickness of from 50 to 500 Å. Referring now to FIG. 4, therein is shown the structure of FIG. 3 after formation of a first spacer 400. Anisotropic etching of the first spacer material layer 300 of FIG. 3 forms the first spacer 400. The first spacer 400 serves four purposes. First, it acts as a spacer for lightly doped drain/source (LDD) formation. Second, the first spacer 400 insures the formation of "wings" outside of the channel region in accordance with the present invention. Third, the gate body portion 202 is protected during the subsequent oxidation. Fourth, the first spacer 400 insures better contrast of the amorphous or polycrystalline silicon line width for optical measurement.

Since the gate body portion 202 and the gate thin layer portion 204 are of the same material, accurate optical measurement of the width of the gate body portion 202 (the amorphous or polycrystalline silicon line width) is difficult because there is little contrast between the two. The contrast is greater or better between the gate body portion 202 and the first spacer 400, which are of different materials.

Referring now to FIG. 5, therein is shown the structure of FIG. 4 after deposition of a second spacer layer 500, which may be oxide formed by tetraethyoxysilane (TEOS) deposition or may be oxynitride.

Referring now to FIG. 6, therein is shown the structure of FIG. 5 after formation of a second spacer 600. Where the second spacer 600 is of oxide, anisotropic oxide etching is used that stops on the thin amorphous or polycrystalline silicon material of the gate thin layer portion 204.

The thickness of the second spacer layer 500 determines the width of the second spacer 600 and hence the length of the wing in accordance with the present invention. The thickness is preferably in the range of from 50 to 800 Å.

The present invention provides a method of forming a wing gate without major changes to a conventional process flow through the use of the first and second spacers 400 and 600. This also provides good control of the amount of wing protrusion and of the source, drain, and emitter (SDE) profile.

Referring now to FIG. 7, therein is shown the structure of FIG. 6 after formation of a wing gate 700 from the gate thin layer portion 204. Anisotropic etching of the amorphous or polycrystalline silicon layer of the gate thin layer portion 204 exposed by the second spacer 600 forms the gate wings 702 of the wing gate 700.

It will be understood that the second spacer 600 could also be multiple spacers, such as double spacers, as represented by a third spacer 710.

Referring now to FIG. 8, therein is shown the structure of FIG. 7 after removal of the second spacer 600 and exposure of the tips of the gate wings 702.

The tips of the gate wings 702 are rounded off by high-pressure (5 to 25 atmospheres)/high-temperature oxidation (800 to 1100° C.) for an amorphous or polycrystalline gate.

In the present invention, it has been discovered that rounding off the gate wings 702 reduces the carrier concentration at the edges of the gate. It has also been discovered that rounding off the corners of the gate wings 702 improves the $I_{off}/I_{on}$ curve and lowers the threshold roll-off for short-channel devices.

Also shown in FIG. 8 the formation of a gate dielectric 800. Where the gate dielectric 800 is a silicon dioxide or nitrided oxide, a time controlled oxide strip used to remove the gate dielectric layer 104 except under the first spacer 400.

This forms what can be described as an inverted-T gate with the gate dielectric 800 being wider than the body portion of the wing gate 700.

Referring now to FIG. 9, therein is shown the structure of FIG. 8 after implantation to form lightly doped drain/source (LDD) regions 900. It has been further discovered that the overhangs of the gate wings 702 cause the LDD regions 900 to be graded with a dopant concentration gradually increasing away from the gate dielectric 800 and substantially increasing away from the overhang of the gate wings 702.

Figure 10:
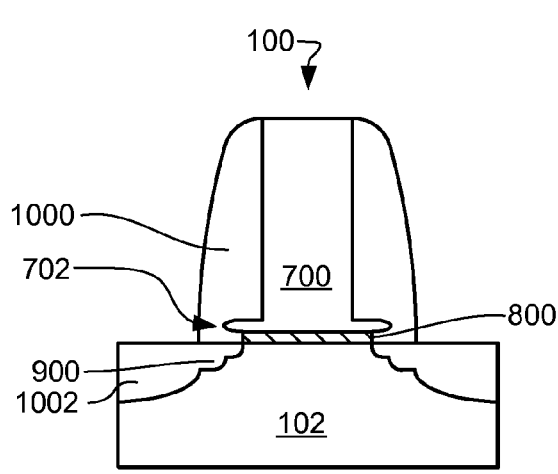
FIG. 10 is the structure of FIG. 9 after removal of the first spacer.

Referring now to FIG. 10, therein is shown the structure of FIG. 9 after removal of the first spacer 400. Where the first spacer 400 is a nitride, a nitride strip is used. After nitride strip, in manufacturing transistors, a further gate processing, an amorphous or polycrystalline silicon re-oxidation, is used to improve transistor lifetimes and gate dielectric reliability due to higher fields occurring at the etched polycrystalline silicon transistor edges.

A further spacer material layer (not shown), such as an oxide formed by TEOS deposition, is deposited directly on the semiconductor substrate 102 and wing gate 700, and etched to form an implantation spacer directly on the wing gate 700 and the gate wings 702. The implantation spacer 1000 is used for the implantation of source/drain regions 1002. The source/drain regions 1002 and the LDD regions 900 form a three-step source/drain profile.

A major problem in the past has been in the formation of the LDD regions of a transistor. Even if the electric field is reduced at the interface between the source/drain regions and gate dielectric, the gate voltage is not applied to the bottom of the conventional sidewall spacer since no gate electrode is formed there. Hence, a strong electric field is still formed in the interface between the source/drain region and the gate dielectric, and this results in generation of the undesirable hot carrier effect. Furthermore, since the conventional gate has no control over the LDD region, the mobility and drive current are reduced due to high parasitic resistance in the LDD region.

It has been discovered that by using the inverted-T gate transistor structure, the strong electric field in the interface between the source/drain regions 1002 and the gate dielectric 800 can be reduced so as to improve hot carrier injection (HCI) by reducing the generation of the hot carrier effect. At the same time, the mobility and drive current can be reduced by the elimination of the high parasitic resistance in the LDD region 900.

Figure 11:
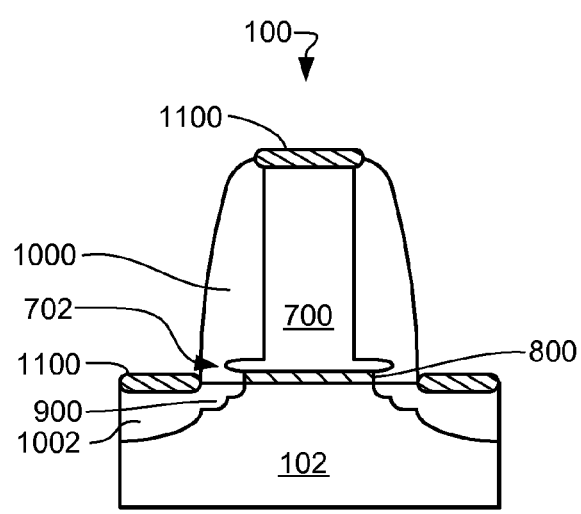
FIG. 11 is the structure of FIG. 10 after salicidation.

Referring now to FIG. 11, therein is shown the structure of FIG. 10 after salicidation to form silicide 1100 over the source/drain regions 1002 and the wing gate 700.

Figure 12:
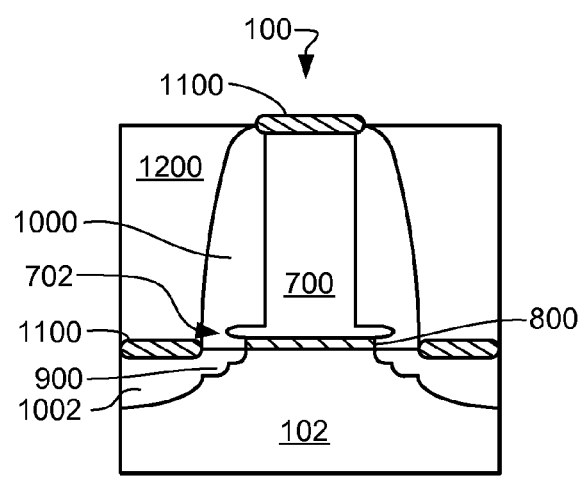
FIG. 12 is the semiconductor device completed in accordance with the present invention to before formation of the source/drain and gate contacts.

Referring now to FIG. 12, therein is shown the semiconductor device 100 completed in accordance with the present invention to before formation of source/drain and gate contacts. A poly-metal dielectric (PMD) 1200 has been deposited over the structure of FIG. 11, and a fixed-time or end point controlled chemical mechanical polishing (CMP) has been performed to expose the silicide 1100 over the gate wings 702.

Figure 13:
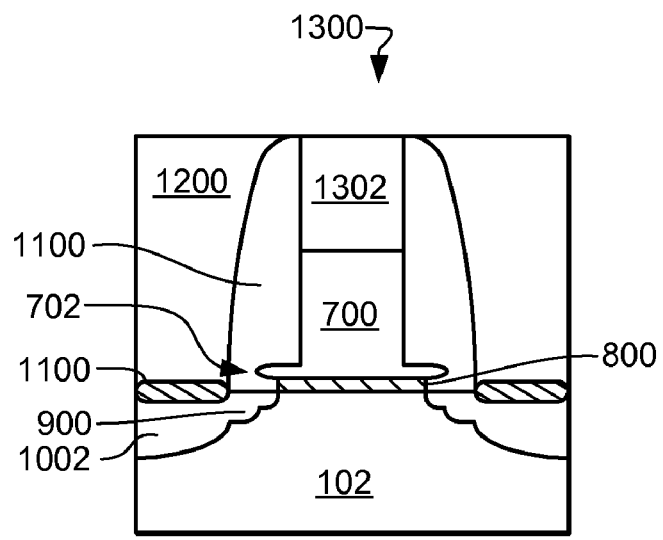
FIG. 13, is an alternative metal gate embodiment of the present invention

Referring now to FIG. 13, therein is shown an alternative metal gate embodiment 1300 of the present invention. The structure of FIG. 12 is subject to chemical mechanical polishing (CMP) until the silicide 1100 over the gate body portion 202 is removed. The gate body portion 202 is anisotropically etched for a fixed time, followed by chemical vapor deposition (CVD) of a metal contact 1302, of a material such as Tungsten (W), to be self-aligned over the wing gate 700. A metal CMP is then performed which stops on the PMD 1200.

Figure 14:
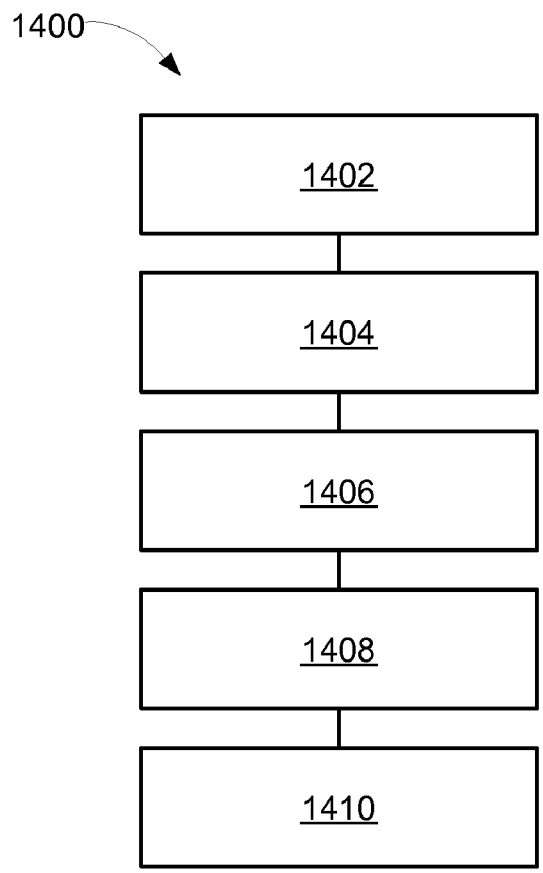
FIG. 14 is a flow chart of a method of manufacture in accordance with the present invention.

Referring now to FIG. 14, therein is shown a method 1400 for manufacturing the semiconductor device 100 in accordance with the present invention. The method 1400 includes: a block 1402 of forming layers of gate dielectric material, gate material, and cap material on a semiconductor substrate; a block 1404 where the cap material and a portion of the gate material are processed to form a cap and a gate body portion; a block 1406 where a wing is formed on the gate body portion from the remaining portion of the gate material; a block 1408 where the gate dielectric material under a portion of the wing on the gate body portion is removed to form a gate dielectric; and a block 1410 where a lightly-doped source/drain is formed in the semiconductor substrate using the gate body portion and the wing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters set forth herein or shown in the accompanying drawings are to be interpreted in an illustrative and non-limiting sense.

The invention claimed is:

1. A semiconductor device comprising:
    a semiconductor substrate;
    a gate dielectric on the semiconductor substrate, the gate dielectric having a first width;
    a wing gate formed as an inverted-T on the gate dielectric, the wing gate having a body portion narrower than the first width and a gate wing wider than the first width;
    an implantation spacer directly on the wing gate and the semiconductor substrate; and
    a lightly-doped source/drain region in the semiconductor substrate adjacent the gate dielectric.

2. The semiconductor device as claimed in claim 1 further comprising:
    the implantation spacer wider than the first width and positioned around the wing gate; and
    a source/drain region in the semiconductor substrate adjacent the spacer and connected to the lightly-doped source/drain region.

3. The semiconductor device as claimed in claim 1 wherein:
    the wing gate comprises the gate wing having a rounded tip.

4. The semiconductor device as claimed in claim 1 further comprising:
    a metal contact over the wing gate.

5. A semiconductor device comprising:
    a silicon substrate;
    a gate dielectric on the silicon substrate, the gate dielectric having a first width;
    a wing gate formed as an inverted-T on the gate dielectric, the wing gate of amorphous or polycrystalline silicon having a body portion narrower than the first width and a gate wing wider than the first width;
    an implantation spacer directly on the wing gate and the silicon substrate; and
    a lightly-doped source/drain region in the silicon substrate adjacent the gate dielectric.

6. The semiconductor device as claimed in claim 5 further comprising:
    the implantation spacer being an oxide spacer wider than the first width and positioned around the wing gate; and
    a source/drain region in the silicon substrate adjacent the oxide spacer and connected to the lightly-doped source/drain region.

7. The semiconductor device as claimed in claim 5 wherein:
    the wing gate comprises the gate wing having a rounded tip;
    a source/drain region in the silicon substrate connected to the lightly-doped source/drain region; and
    the implantation spacer being an oxide spacer wider than the first width and positioned around the wing gate, the oxide spacer cooperating with the gate wing to form a three-step source/drain profile of the lightly-doped source/drain region and the source/drain region.

8. The semiconductor device as claimed in claim 5 further comprising:
    a metal contact over the body portion of the wing gate.

* * * * *